United States Patent
Sakamoto

(10) Patent No.: US 7,531,957 B2
(45) Date of Patent: May 12, 2009

(54) DISPLAY APPARATUS AND MANUFACTURING METHOD THEREFOR

(75) Inventor: Yoshiaki Sakamoto, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 141 days.

(21) Appl. No.: 10/571,139

(22) PCT Filed: Sep. 10, 2003

(86) PCT No.: PCT/JP03/11544

§ 371 (c)(1),
(2), (4) Date: Dec. 5, 2006

(87) PCT Pub. No.: WO2005/027582

PCT Pub. Date: Mar. 24, 2005

(65) Prior Publication Data

US 2007/0080627 A1    Apr. 12, 2007

(51) Int. Cl.
*H01J 63/04* (2006.01)
*H01J 1/62* (2006.01)

(52) U.S. Cl. .................. 313/504; 313/498; 313/505; 313/506; 313/512

(58) Field of Classification Search .............. None
See application file for complete search history.

(56) References Cited

U.S. PATENT DOCUMENTS 5,168,230 A * 12/1992 Hashoian et al. ............ 324/318
5,834,893 A * 11/1998 Bulovic et al. .............. 313/506
2002/0018173 A1    2/2002 Furukawa et al.
2002/0020053 A1 * 2/2002 Fonash et al. ............... 427/2.1
2005/0029937 A1 * 2/2005 Kim ........................... 313/506
2006/0214277 A1 * 9/2006 Saeki .......................... 257/684

FOREIGN PATENT DOCUMENTS

| JP | 10-12385 A | 1/1998 |
|---|---|---|
| JP | 2002-25765 A | 1/2002 |
| JP | 2002-216958 A | 8/2002 |
| JP | 2003-17244 A | 1/2003 |
| JP | 2003-86359 A | 3/2003 |
| JP | 2003-168556 A | 6/2003 |
| JP | 2003-205574 A | 7/2003 |

* cited by examiner

*Primary Examiner*—Sikha Roy
*Assistant Examiner*—Natalie K Walford
(74) *Attorney, Agent, or Firm*—Birch, Stewart, Kolasch & Birch, LLP

(57) ABSTRACT

A display apparatus including a substrate 22; an organic EL device including an electrode 24 which is formed on the substrate 22, an organic EL layer 26 which is formed on the electrode 24, and an electrode 30 which is formed on the organic EL layer 26; an inorganic insulating film 34 which is formed on the organic EL device, sealing the organic EL layer; and a substrate 38 which is formed on the inorganic insulating film 34, wherein the material and the thickness of the substrate 22 and the substrate 38 are set such that the neutral axis when a bending stress is applied is located in the vicinity of the interface between the inorganic insulating film 34 and the substrate 38. By configuring such a display apparatus, occurrence of cracks in the inorganic insulating film is prevented, and the organic EL device can be effectively protected against moisture and oxygen. As a result, the reliability of the display apparatus can be improved.

21 Claims, 10 Drawing Sheets

DISPLAY APPARATUS AND MANUFACTURING METHOD THEREFOR

TECHNICAL FIELD

The present invention relates to a display apparatus and a manufacturing method therefor, and particularly relates to a self-emitting type display apparatus using an organic electroluminescent (EL) device and a manufacturing method therefor.

BACKGROUND ART

Conventionally, as a flat panel display, a liquid crystal display apparatus which uses a liquid crystal molecule as a shutter has been mainly used. In recent years, as a display apparatus which achieves further ultra-thinness and expanded display size, a self-emitting type display apparatus using an organic EL device has attracted attention.

The display apparatus using an organic EL device has a structure in which plural devices including an electrode (anode) in the shape of a stripe that is made up of a transparent conductive film; an electrode (cathode) in the shape of a stripe that is made up of a metallic thin film, and is orthogonal to the anode; and an organic EL layer formed between these electrodes are provided on a transparent substrate. The anodes and the cathodes are arranged in the shape of a matrix, and the respective intersecting portions of the anodes and the cathodes each correspond to a pixel. By applying a prescribed driving voltage between prescribed electrodes, a prescribed pixel can be caused to emit light.

Such an organic EL device, unlike the liquid crystal device utilizing liquid crystal molecules sandwiched between two substrates as a shutter, is of self-emitting type, and thus offers various advantages, such as that it has a high visibility; does not have viewing angle dependence; allows use of a film substrate having flexibility; is thin and lightweight, compared to the liquid crystal display apparatus; and the like.

On the other hand, because of using organic matter, the organic EL device easily reacts with moisture, oxygen, and the like, which can result in degradation of the characteristics thereof. In other words, when the organic EL layer reacts with moisture and oxygen in the air to cause corrosion and oxidation, the degraded portion becomes a non-light-emitting part (a dark spot), resulting in the light-emitting function of the device being lost. Therefore, it is necessary to take various measures for protecting the organic EL device against the surrounding air.

Examples of prior art documents disclosing such a measure include patent document 1 (Japanese Patent Application Laid-Open No. 10-012385), the patent document 2 (Japanese Patent Application Laid-Open No. 2002-025765), patent document 3 (Japanese Patent Application Laid-Open No. 2003-017244), and patent document 4 (Japanese Patent Application Laid-Open No. 2003-086359).

In the patent document 1, a display apparatus in which an organic EL device is sealed with a glass plate or a metallic plate is proposed. However, in this method, the thickness and weight of the glass plate cancels the feature of thin and lightweight structure of the organic EL device.

In addition, in the patent documents 2 to 4, a display apparatus having a thin-type structure in which a resin film for stress relaxation and an inorganic film for protection against the surrounding air are laminated on the organic EL device, and in which the organic EL device is sealed by these laminated films, is proposed. However, as an inorganic film which is provided for the purpose of protection against the surrounding air, a material, such as a silicon oxide film, a silicon nitride film, a silicon nitride-oxide film, or the like, which is inferior in flexibility to the resin film, is generally used. Therefore, when stresses are concentrated on this layer, a crack is generated in some cases. For example, when the entire display apparatus including the substrate on which the organic EL device is formed is bent, stresses are most concentrated on the substrate surface, and thus, stresses are concentrated on the inorganic film which is located on the surface, resulting in a rupture. Such a crack in the inorganic film causes the sealing function to be lost, resulting in the organic EL device being degraded. In addition, the resin film provided in the layer under the inorganic film has a high moisture permeability and moisture-holding ability, as compared to the inorganic film, and thus, the resin film adjacent to the organic EL device may cause the organic EL device to be degraded.

In addition, as is stated in the patent document 3, for example, it can be supposed that, by repeatedly laminating plural resin films and plural inorganic films, the moisture resistance is improved. However, with a structure in which plural resin films and plural of inorganic films are repeatedly laminated, the number of manufacturing processes is increased, and the manufacturing cost is increased.

The present invention relates to a display apparatus using an organic EL device and a manufacturing method therefor, and a purpose of the present invention is to provide a structure of a display apparatus that provides the organic EL device with high protection against the surrounding air and high flexibility, and manufacturing method for a display apparatus that can realize such a structure by a simple process at low cost.

DISCLOSURE OF THE INVENTION

The above-mentioned purpose is achieved by a display apparatus comprising a first substrate; an organic EL device comprising a first electrode which is formed on the first substrate, an organic EL layer which is formed on the first electrode, and a second electrode which is formed on the organic EL layer; a first inorganic insulating film which is formed on the organic EL device, sealing the organic EL layer; and a second substrate which is formed on the first inorganic insulating film, wherein the material and the thickness of the first substrate and the second substrate are set such that the neutral axis when a bending stress is applied is located in the vicinity of the interface between the first inorganic insulating film and the second substrate.

In addition, the above-mentioned purpose is also achieved by a display apparatus comprising a first substrate; an organic EL device comprising a first electrode which is formed on the first substrate, an organic EL layer which is formed on the first electrode, and a second electrode which is formed on the organic EL layer; a first inorganic insulating film which is directly formed on the organic EL device, sealing the organic EL layer; and a second substrate which is formed on the first inorganic insulating film.

In addition, the above-mentioned purpose is also achieved by a manufacturing method for a display device, comprising forming a first electrode on a first substrate; forming an organic EL layer on the first electrode; forming a second electrode on the organic EL layer; forming a first inorganic insulating film so as to seal the organic EL layer; forming, on the first inorganic insulating film, a second substrate in which the material and the thickness are set such that the neutral axis when a bending stress is applied is located in the vicinity of the interface with the first inorganic insulating film.

According to the present embodiment, a substrate is formed on the inorganic insulating film for sealing the organic EL device, whereby the neutral axis when a bending stress is applied can be brought close to the inorganic insulating film, and thus, occurrence of cracks in the inorganic insulating film can be prevented, which allows the organic EL device to be effectively protected against moisture and oxygen. As a result, the reliability of the display apparatus can be improved.

In addition, on the top surface side of the organic EL device, an inorganic insulating film for sealing the organic EL device is formed with no organic insulating film being provided therebetween, whereby degradation of the organic EL device due to moisture and oxygen during the manufacturing process and after the manufacture thereof can be suppressed.

In addition, also on the lower side of the organic EL device, an inorganic insulating film for sealing the organic EL device is further formed, whereby degradation of the organic EL device due to moisture and oxygen during the manufacturing process and after the manufacture thereof can be further suppressed.

In addition, the series of film formation processes from the formation of the organic EL layer to the formation of the inorganic insulating film is carried out consecutively in a vacuum environment, and thus, the organic EL layer can be sealed by the inorganic insulating film without being exposed to moisture and oxygen in the atmosphere during manufacturing, which allows degradation of the characteristics of the organic EL device to be further suppressed.

BEST MODE FOR CARRYING OUT THE INVENTION

[Principle of the Present Invention]

In the present invention, by further forming a prescribed substrate on an inorganic insulating film to locate the neutral axis at which the tensile stress occurring in bending the display apparatus is balanced with the compressive stress, resulting in a no-stress state being produced, in the vicinity of the inorganic insulating film, the bending stress acting on the organic insulating film is suppressed.

Hereinbelow, the details of the present principle will be described.

The location $y_n$ (the distance from the bottom surface) of the neutral axis of a laminate made up of a plurality of layers is expressed by the following general equation (see, for example, JSME Mechanical Engineer's Handbook, for example), assuming that the respective layers are integrated into a rigid body, and no slippage is produced between layers. Herein, E is the Young's modulus, A is the sectional area, and $y_z$ is the distance from the bottom surface to a given point on the section.

$$y_n = \frac{\sum \left( E \cdot \int y_z dA \right)}{\sum (E \cdot A)} \quad (1)$$

Figure 1A:
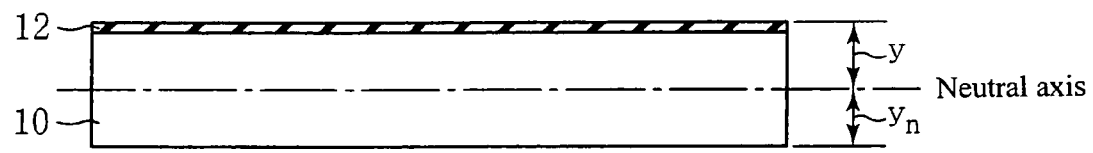
FIG. 1 are drawings (a first set) illustrating the principle of the display apparatus according to the present invention.
Figure 1B:
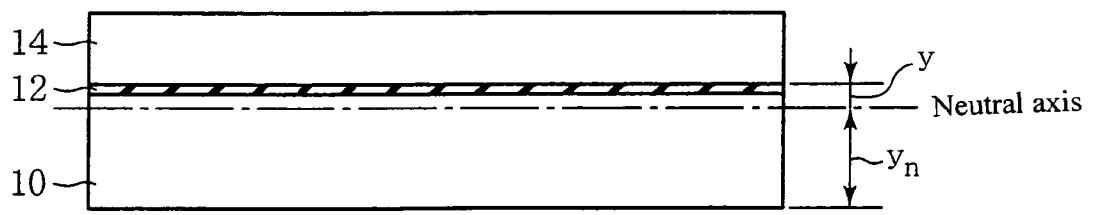

Herein, let's assume a first sample in which an inorganic insulating film 12 is formed on a first substrate 10 (FIG. 1A), and a second sample in which an inorganic insulating film 12 and a second substrate 14 are formed on a first substrate 10 (FIG. 1B).

If the Young's modulus for the first substrate is $E_1$, and the thickness is $t_1$; the Young's modulus for the inorganic insulating film is $E_2$, and the thickness is $t_2$; and the Young's modulus for the second substrate is $E_3$, and the thickness is $t_3$, the distance $y_n$ to the neutral axis in the first sample is expressed as follows, from equation (1), $$y_n = \frac{E_1 \cdot t_1^2 + E_2 \cdot t_2 \cdot (2 \cdot t_1 + t_2)}{2 \cdot (E_1 \cdot t_1 + E_2 \cdot t_2)} \quad (2)$$

and the distance $y_n$ to the neutral axis in the second sample is expressed as:

$$y_n = \frac{E_1 \cdot t_1^2 + E_2 \cdot t_2 \cdot (2 \cdot t_1 + t_2) + E_3 \cdot t_3 \cdot (2 \cdot t_1 + 2 \cdot t_2 + t_3)}{2 \cdot (E_1 \cdot t_1 + E_2 \cdot t_2 + E_3 \cdot t_3)} \quad (3)$$

When this laminate is subjected to a bending moment M to bend it with a radius of curvature, r, the stress $\sigma_2$ acting on the inorganic insulating film meets the following simultaneous equations (see, for example, JSME Mechanical Engineer's Handbook). Herein, y is the distance from the neutral axis to the evaluation point.

$$\frac{1}{r} = \frac{M}{\sum (E \cdot I)} \quad (4)$$

$$\sigma_2 = \frac{E_2 \cdot y \cdot M}{\sum (E \cdot I)} \quad (5)$$

From equations (4) and (5), the maximum stress $\sigma_{max}$ acting on the front face side of the inorganic insulating film (the side of the interface with the second substrate) when the radius of curvature is r is expressed as follows, from $y=|t_1+t_2-y_n|$:

$$\sigma_{max} = \frac{E_2 \cdot |t_1 + t_2 - y_n|}{r} \quad (6)$$

At this time, by selecting the radius of curvature r and the distance $y_n$ to the neutral axis, i.e., the radius of curvature r, and the Young's modulus E and the thickness t for the respective members such that the maximum stress $\sigma_{max}$ does not exceed the breaking strength $\sigma_c$ of the inorganic insulating film, the breaking of the inorganic insulating film can be prevented.

It is proper that the radius of curvature r indicating the bent state is grasped as the dimension by which the laminate can be bent to the breaking limit for the inorganic insulating film as a result of selecting the Young's modulus E and the thickness t for the respective members for constituting the laminate. Therefore, for a structure for which the flexibility is demanded (a structure for which the allowable radius of curvature r is to be minimized), it is necessary to properly select the Young's modulus E and the thickness t for the respective members.

As can be seen from equation (6), in order to minimize the maximum stress $\sigma_{max}$, it is necessary to minimize the distance from the neutral axis to the evaluation point, $y=|t_1+t_2-y_n|$.

Figure 2A:
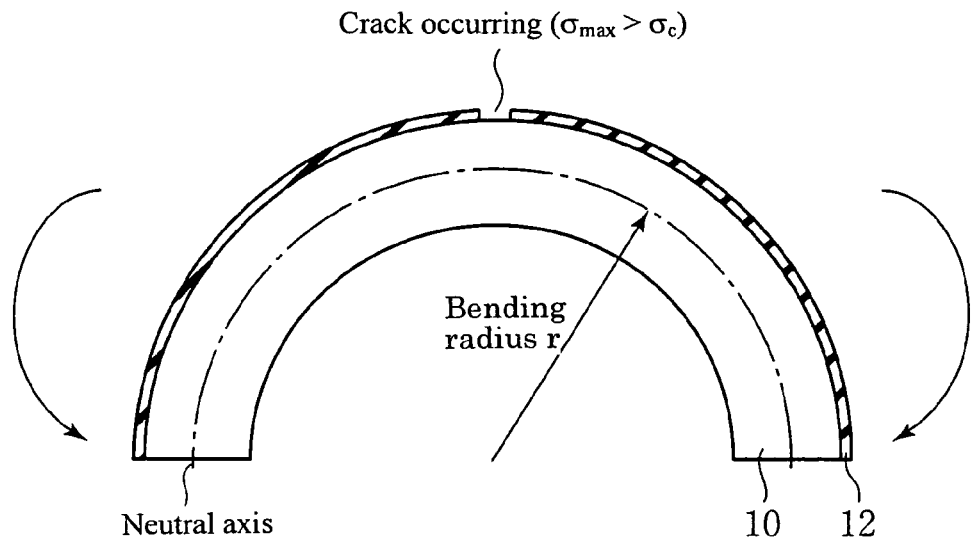
FIG. 2 are drawings (a second set) illustrating the principle of the display apparatus according to the present invention.
Figure 2B:
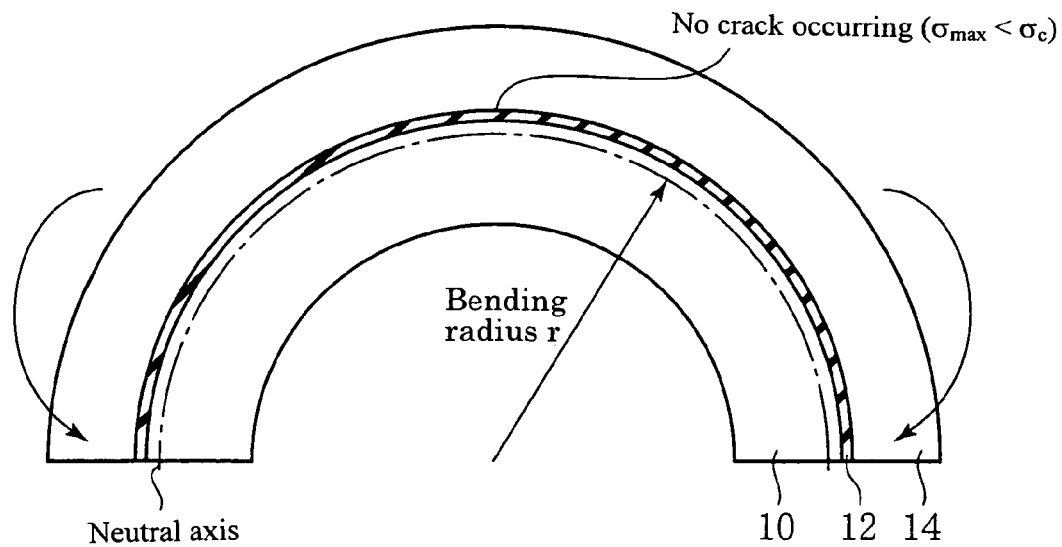

With the first sample, the neutral axis is in the vicinity of the section center of the first substrate, and the distance y is great (as shown in FIG. 2A), while, with the second sample, the neutral axis is in the vicinity of the inorganic insulating film which is between the first substrate and the second substrate, with the distance y being decreased (as shown in FIG. 2B). Therefore, the second sample provides a structure which has a high flexibility, as compared to that of the first sample.

Particularly, by rendering the inorganic insulating film thin with respect to the respective substrate thicknesses ($t_1$, $t_3 \gg t_2$), and neglecting the term for the thickness $t_2$ of the inorganic insulating film in equation (3), the distance y from the neutral axis to the evaluation point is expressed as follows:

$$y = \frac{|E_1 t_1^2 - E_3 t_3^2|}{2(E_1 t_1 + E_3 t_3)} \quad (7)$$

Therefore, in order to minimize the distance y, the following requirement for making the y in equation (7) zero must be met.

$$E_1 t_1^2 = E_3 t_3^2 \quad (8)$$

Thus, from the viewpoint of most effectively preventing a crack from occurring in the inorganic insulating film, it is desirable that the material and the film thickness of the substrate be set such that the relationship of equation (8) is met. In other words, it is desirable that the two substrates, i.e., the first substrate and the second substrate, which sandwich the organic EL device have the same rigidity. However, whether a crack occurs in the inorganic insulating film depends not only on the distance from the neutral axis, but also on the material, the radius of curvature, and the like, for the inorganic insulating film. Therefore, it is preferable that the ranges of the selection of substrate material and thickness of the substrate are appropriately set according to the material and the radius of curvaturer of the inorganic insulating film, with the condition that the relationship of equation (8) is met being the central condition.

According to the study by the present inventor, it is desirable to select the substrate material and set the substrate thickness, and the like, such that the neutral axis is located between the inorganic insulating film and the location corresponding to 40% of the thickness of the substrate. In other words, it is desirable that the neutral axis be located between the location on the first substrate side corresponding to 40% of the thickness of the first substrate from the interface of the inorganic insulating film on the first substrate side, and the location on the second substrate side corresponding to 40% of the thickness of the second substrate from the interface of the inorganic insulating film on the second substrate side.

It is desirable that the inorganic insulating film for protecting the organic EL device against the surrounding air be directly formed on the organic EL device. If an organic insulating film, such as a resin film, or the like, is formed between the organic EL layer and the inorganic insulating film, moisture is absorbed into this organic insulating film in the manufacturing process, or the like, and such moisture may cause degradation of the organic EL device later, because an organic insulating film has such properties that the moisture permeability and the moisture-holding ability are high. By forming the inorganic insulating film directly on the organic EL device as with the display apparatus according to the present embodiment, penetration of moisture can be considerably suppressed.

In addition, from the viewpoint of preventing inclusion of moisture and oxygen during the manufacturing process, and degradation of the organic EL device resulting therefrom, it is desirable that the organic EL device and the inorganic insulating film be formed consecutively in a vacuum environment. Thereby, the organic EL device can be configured, being completely protected against the surrounding air.

In addition, when the first substrate is an organic material, such as a resin film, it is desirable that penetration of moisture and oxygen from the first substrate side be also prevented. To do this, it is effective to previously form the inorganic insulating film on the surface of the substrate before forming the organic EL device.

In addition, in laminating the second substrate, by vacuum laminating the second substrate which is previously coated with an adhesive, and the first substrate on which the organic EL device and the inorganic insulating film are laminated, an integral structure in which there is no void between the first substrate and the second substrate can be formed.

As the first substrate and the second substrate, substances having flexibility, such as resin films prepared as thin films from resin materials, such as polyethyleneterephthalate (PET), polycarbonate, amorphous polyolefin, and the like, cellophane, and the like, and the flexible substrate can be applied.

As the material of the electrode of the anode side of the organic EL device, ITO, ATO ($SnO_2$ dope with Sb), AZO (ZnO doped with Al), and the like, can be used.

For the organic EL layer, the single layer structure having only the luminescent layer, the two-layer structure having a hole transport layer and a luminescent layer or having a luminescent layer and an electron transport layer, or the three-layer structure having a hole transport layer, a luminescent layer, and an electron transport layer can be applied.

The luminescent layer preferably includes a fluorescent substance which has a fluorescent characteristic in the visible region, and a good film formability. Examples of the substance which can be applied include fluorescent brightening agents, such as a quinolinol aluminum complex ($Alq_3$: 8-hydroxyquinoline aluminum), Be-benzoquinolinol ($BeBq_2$), and benzooxazole such as 2,5-bis(5,7-di-t-pentyl-2-benzooxazolyl)-1,3,4-thiadizole, 4,4'-bis(5,7-pentyl-2- benzooxazolyl)stilbene, 4,4'-bis[5,7-di-(2-methyl-2-butyl)-2-benzooxazolyl]stilbene, 2,5-bis(5,7-di-t-pentyl-2-benzooxazolyl)thiofin, 2,5-bis([5-α,α-dimethylbenzyl]-2-benzooxazolyl)thiophene, 2,5-bis[5,7-di-(2-methyl-2-butyl)-2-benzooxazolyl]-3,4-diphenylthiophene, 2,5-bis(5-methyl-2-benzooxazolyl)thiophene, 4,4'-bis(2-benzooxaizolyl)biphenyl, 5-methyl-2-[2-[4-(5-methyl-2-benzooxazolyl)phenyl]vinyl]benzooxazolyl, 2-[2-(4-chlorophenyl)vinyl]naphtho[1,2-d]oxazole, or the like, benzothiazole such as 2,2'-(p-phenylenedivinylene)-bisbenzothiazole, or the like, benzoimidazol such as 2-[2-[4-(2-benzoimidazolyl)phenyl]vinyl]benzoimidazol, 2-[2-(4-carboxyphenyl)vinyl]benzoimidazol, or the like; 8-hydroxyquinoline metal complexes, such as tris(8-quinolinol)aluminum, bis(8-quinolinol)magnesium, bis(benzo[f]-8-quinolinol)zinc, bis(2-methyl-8-quinolinolate)aluminum oxide, tris(8-quinolinol)indium, tris(5-methyl-8-quinolinol)aluminum, 8-quinolinollithium, tris(5-chloro-8-quinolinol)gallium, bis(5-chloro-8-quinolinol)calcium, poly[zinc-bis(8-hydroxy-5-quinolinonyl)methane], and the like; metal chelated oxynoid compounds, such as dilithium epindrydione, and the like; styrylbenzene compounds, such as 1,4-bis (2-methylstyryl)benzene, 1,4-(3-methylstyryl) benzene, 1,4-bis(4-methylstyryl)benzene, distyrylbenzene, 1,4-bis(2-ethylstyryl) benzene, 1,4-bis(3-ethylstyryl)benzene, 1,4-bis (2-methylstyryl)2-methylbenzene, and the like; distylpyrrazine derivatives, such as 2,5-bis(4-methylstyryl) pyrrazine, 2,5-bis(4-ethylstyryl) pyrrazine, 2,5-bis[2-(1-naphthyl)vinyl]pyrrazine, 2,5-bis(4-methoxystyryl)pyrrazine, 2,5-bis[2-(4-biphenyl)vinyl]pyrrazine, 2,5-bis [2-(1-pylenyl)vinyl]pyrrazine, and the like; naphthalimide derivatives, perrylene derivatives, oxadiazole derivatives, aldazine derivatives, cyclopentadiene derivatives, styrylamine derivatives, coumarine derivatives, aromatic dimethylidin derivatives, and the like. In addition, anthracene, salicylates, pyrene, coronene, and the like, can also be applied.

As the hole transport layer, the substance which has a high hole mobility, and is transparent and good in film formability is preferable, and examples of the substance which can be applied include organic materials, such as porphyrin compounds, such as N,N'-diphenyl-N,N'-bis(3-methylphenyl)-1,1'-diphenyl-4,4'-diamine(TPD), porphine, tetraphenylporphine copper, phthalocyanine, copper phthalocyanine, titanium phthalocyanine oxide, and the like; aromatic tertiary amines, such as 1,1-bis{4-(di-p-tolylamino) phenyl}cyclohexane, 4,4',4"-trimethyltriphenylamine, N,N, N',N'-tetrakis(p-tolyl)-p-phenylenediamine, 1-(N,N-di-p-tolylamino)naphthalene, 4,4'-bis(dimethylamino)-2-2'-dimethyltriphenylmethane, N,N,N',N'-tetraphenyl-4,4'-diaminobiphenyl, N,N'-diphenyl-N,N'-di-m-tolyl-4, N,N-diphenyl-N,N'-bis(3-methylphenyl)-1,1'-4,4'-diamine, 4'-diaminobiphenyl, N-phenylcarbazole, and the like; stilbene compounds, such as 4-di-p-tolylaminostilbene, 4-(di-p-tolylamino)-4'-[4-(di-p-tolylamino)styryl]stilbene, and the like; triazole derivatives, oxadiazole derivatives, imidazole derivatives, polyarylalkane derivatives, pyrrazoline derivatives, pyrrazolone derivatives, phenylenediamine derivatives, arylamine derivatives, amino-substituted chalcone derivatives, oxazole derivatives, styrylanthracene derivatives, fluolenone derivatives, hydrazone derivatives, silazane derivatives, polysilane-aniline-based copolymers, high-molecular-weight oligomers, styrylamine compounds, aromatic dimethylidene compounds, poly3-methylthiophene, and the like. In addition, the polymer-dispersed hole transport layer in which a low-molecular-weight organic material for hole transport layer is dispersed in a polymer, such as polycarbonate, or the like, can also be applied.

As the electron transport layer, oxadiazole derivatives, such as 1,3-bis(4-tert-butylphenyl-1,3,4-oxadiazolyl)phenylene(OXD-7), and the like; anthraquinodimethane derivatives, diphenylquinone derivatives, and the like, can be applied.

As the electrode material of the cathode side of the organic EL device, metals or alloys having a low work function, for example, metals, such as Al, In, Mg, Ti, and the like; magnesium alloys, such as Mg—Ag alloy, Mg—In alloy, and the like; and aluminum alloys, such as AL-Li alloy, Al—Sr alloy, Al—Ba alloy, and the like; and the like can be applied. In addition, as the inorganic insulating film, the silicon oxide film, the silicon nitride film, the silicon nitride-oxide film, and the like can be applied.

First Embodiment

Figure 3:
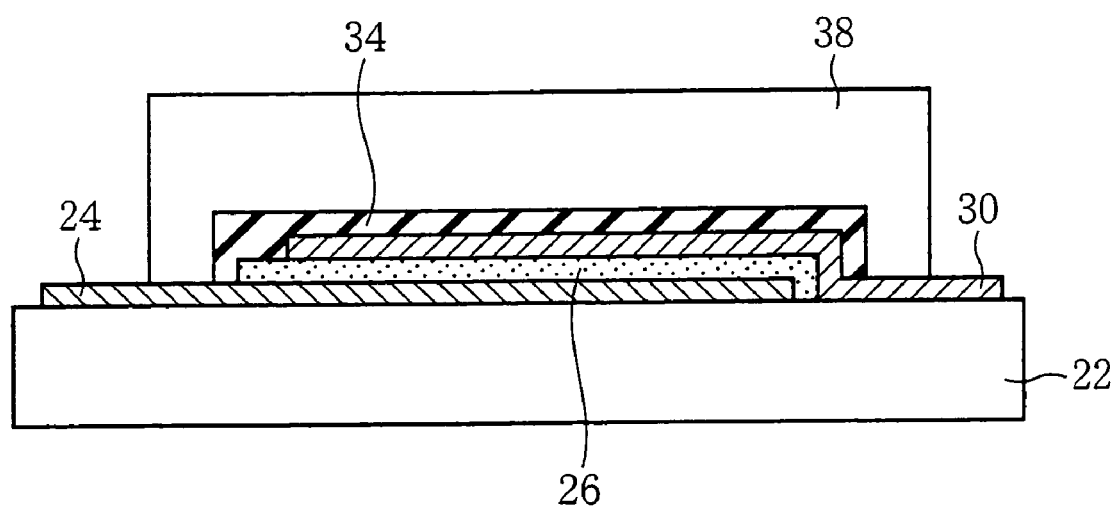
FIG. 3 is a schematic sectional view illustrating the structure of the display apparatus according to a first embodiment of the present invention.

A display apparatus and a manufacturing method therefor according to a first embodiment of the present invention will be described with reference to FIGS. 3 to 5. FIG. 3 is a schematic sectional view illustrating the structure of the display apparatus according to the present embodiment, and FIGS. 4 and 5 are process sectional views illustrating the manufacturing method for a display apparatus according to the present embodiment.

First, the structure of the display apparatus according to the present embodiment will be described with reference to FIG. 3.

On a substrate 22 made up of polycarbonate, an electrode 24 of the anode side made up of ITO is formed. On the electrode 24, an organic EL layer 26 including a hole transport layer made up of α-NPD (diphenylnaphthyldiamine) and a luminescent layer made up of $Alq_3$ (a quinolinol aluminum complex) is formed. On the organic EL layer 26, an electrode 30 of the cathode side made up of Al—Li is formed. Thereby, an organic EL device including the electrode 24, the organic EL layer 26, and the electrode 30 is configured. On the substrate 22 on which the organic EL device is formed, an inorganic insulating film 34 made up of a silicon nitride-oxide film is formed such that it seals the organic EL layer 26. On the inorganic insulating film 34, a substrate 38 made up of cellophane is formed.

Thus, the display apparatus according to the present embodiment has a feature of that, on the organic EL device, the inorganic insulating film 34 is directly formed. If an organic insulating film, such as a resin film, or the like, is formed between the organic EL layer 26 and the inorganic insulating film 34, moisture is absorbed into this organic insulating film in the manufacturing process, or the like, because an organic insulating film has such properties that the moisture permeability and the moisture-holding ability are high, and such moisture may cause degradation of the organic EL device later. By forming the inorganic insulating film 34 directly on the organic EL device as with the display apparatus according to the present embodiment, penetration of moisture can be considerably suppressed.

In addition, the display apparatus according to the present embodiment has another feature of that, on the inorganic insulating film 34, the substrate 38 is formed. As described above, in order to prevent the inorganic insulating film 34 from occurring a crack, it is required to bring the location of the inorganic insulating film 34 close to the neutral axis. Then, with the display apparatus according to the present embodiment, the substrate 38 is formed on the inorganic insulating film 34 to bring the neutral axis close to the inorganic insulating film 34. Thereby, crack occurrence in the inorganic insulating film 34 is prevented, which allows the organic EL device to be effectively protected against moisture and oxygen.

Next, the manufacturing method for a display apparatus according to the present embodiment will be described with reference to FIGS. 4 and 5.

First, on a glass substrate 20 with a thickness of 1 mm, the substrate 22 is set provisionally. As the substrate 22, a polycarbonate film can be applied. As the polycarbonate film, ELECLEAR® HT100-60B (manufactured by Teijin Limited) can be used, for example. This polycarbonate film has a film thickness of 100 μm, an ITO film being formed on the surface.

Figure 4A:
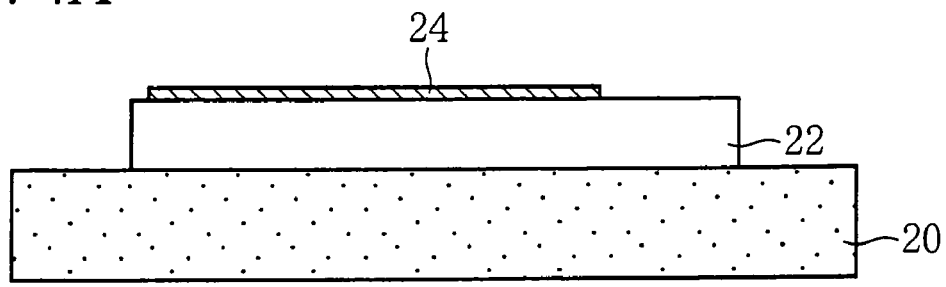
FIG. 4 are process sectional views (a first set) illustrating the manufacturing method for a display apparatus according to the first embodiment of the present invention.

Then, by the lithography and etching, the ITO film on the polycarbonate film is patterned to form the electrode 24 made up of an ITO film (FIG. 4A).

Figure 4B:
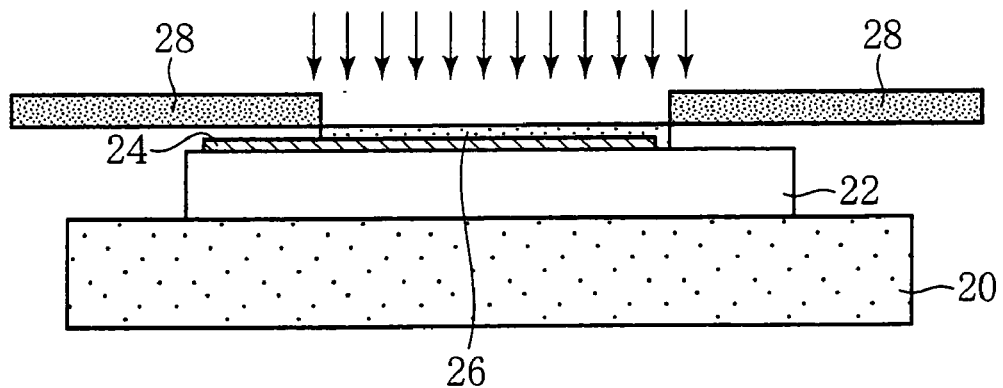

Then, by the vacuum deposition method, a hole transport layer made up of α-NPD, and a luminescent layer made up of $Alq_3$ are deposited to form the organic EL layer 26 having a total film thickness of 150 nm. At this time, by carrying out the vacuum deposition using a metal mask 28 having a prescribed opening pattern for coverage, the organic EL layer 26 having a desired pattern is formed (FIG. 4B).

Figure 4C:
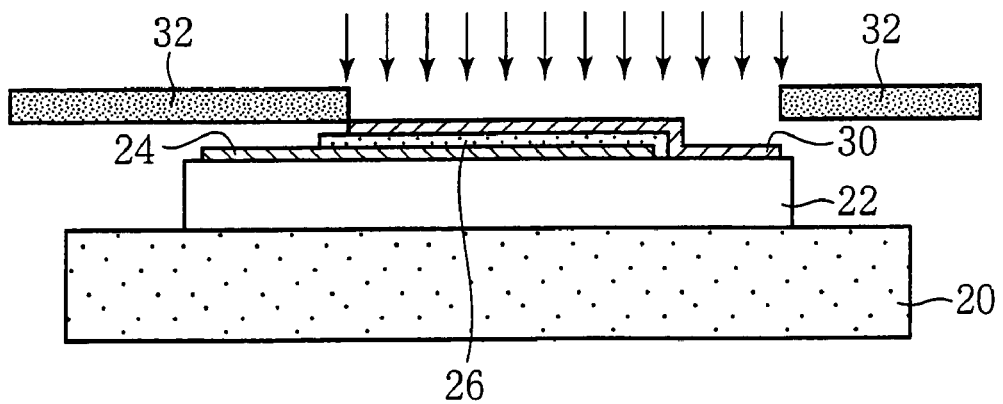

Then, by the vacuum deposition method, Al—Li alloy having a film thickness of 100 nm is deposited on the organic EL layer 26 to form the electrode 30 made up of AL—Li alloy. At this time, by carrying out the vacuum deposition using a metal mask 32 having a prescribed opening pattern for coverage, the electrode 30 having a desired pattern is formed (FIG. 4C).

Thus, an organic EL device having the electrode 24, the organic EL layer 26, and the electrode 30 is formed.

Figure 5A:
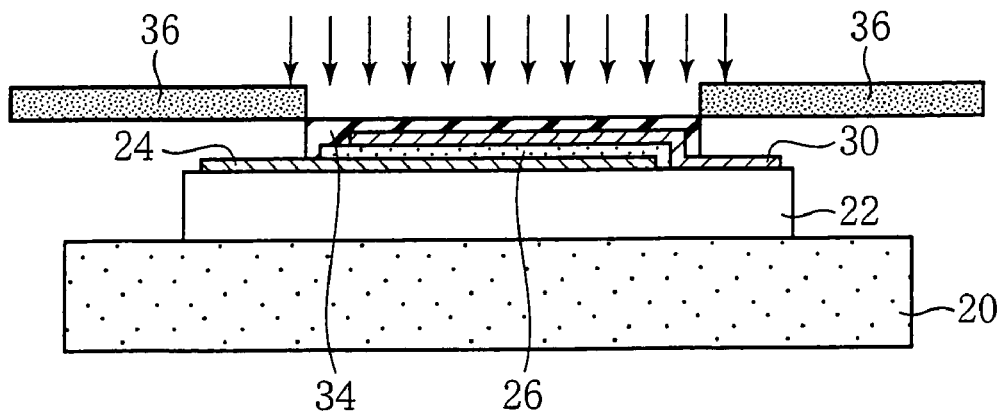
FIG. 5 are process sectional views (a second set) illustrating the manufacturing method for a display apparatus according to the first embodiment of the present invention.

Then, by the plasma coating method (with a PCS apparatus manufactured by Sumitomo Heavy Industries, Ltd.), the inorganic insulating film 34 made up of a silicon nitride-oxide film having a film thickness of 150 nm, for example, is formed on the substrate 22 on which the organic EL device is formed. At this time, by carrying out the vacuum deposition using a metal mask 36 having a prescribed opening pattern for coverage, the inorganic insulating layer 34 having a desired pattern is formed (FIG. 5A). The inorganic insulating film 34 is for sealing the organic EL layer 26, and is formed such that the organic EL layer 26 is fully covered.

In formation of a silicon nitride-oxide film, it is required to minimize the effects of the film stress relaxation and the substrate temperature on the organic EL material. As means for this, for example, a method which scans five times, depositing a film 30 nm thick per scan, and cools the substrate at the time of waiting for film formation (during an interval between scans) can be considered. By using such a method, the substrate temperature can be held to below 75 deg C. and a uniform inorganic insulating film 34 which is free from defects, such as pin holes, and the like, can be formed, with no cracks occurring in the inorganic insulating film 34.

In addition, in the series of film formation processes from the formation of the organic EL layer 26 to the formation of the inorganic insulating film 34, it is desirable to carry out the film formation consecutively in a vacuum environment without exposing the substrate on which the organic EL layer 26 is formed to the atmosphere. Thereby, the organic EL layer 26 can be sealed by the inorganic insulating film 34 without being exposed to moisture and oxygen in the atmosphere during manufacturing, which allows degradation of the characteristics of the organic EL device to be suppressed.

Figure 5B:
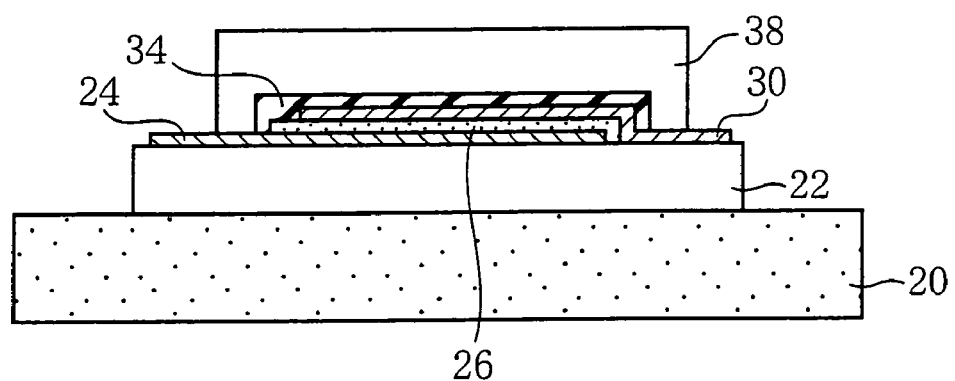

Then, on the inorganic insulating film 34, the substrate 38 is formed such that the inorganic insulating film 34 is covered (FIG. 5B). As the substrate 38, a cellophane tape having a film thickness of 50 μm (manufactured by NICHIBAN CO., LTD.), for example, can be used to be affixed.

Figure 5C:
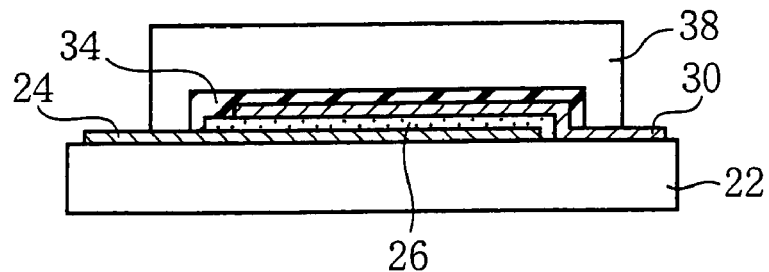

Then, by removing the glass substrate 20, a display apparatus as shown in FIG. 3 is manufactured (FIG. 5C).

The display apparatus manufactured by the above-mentioned manufacturing method was subjected to bending with a radius of curvature of 5 mm to examine whether a crack occurs in the inorganic insulating film.

With the above-mentioned structure for which, as the substrate 22, a polycarbonate film (with a Young's modulus of 1.9 GPa) having a thickness of 100 μm, was used, and as the substrate 38, a cellophane tape (with a Young's modulus of 2.4 GPa) having a thickness of 50 μm was used, the distance y from the neutral axis to the interface between the inorganic insulating film 34 and the substrate 38 was 21 μm, and no crack occurred in the inorganic insulating film 34.

For comparison, a structure for which, as the substrate 22, a polycarbonate (with a Young's modulus of 1.9 GPa) having a thickness of 100 μm was used, and as the substrate 38, an aluminum tape (with a Young's modulus of 69 GPa) with a film thickness of 100 μm was examined, and it was found that the distance y from the neutral axis to the interface between the inorganic insulating film 34 and the substrate 38 was 47 μm, and a crack occurred in the inorganic insulating film 34. The cause of that a crack occurred when an aluminum tape was used as the substrate 38 is that the rigidity for the substrate 38 is too high for the substrate 22, which resulted in the neutral axis being brought far from the inorganic insulating film 34 on the substrate 38 side.

In addition, a structure for which, as the substrate 22, a polycarbonate film (with a Young's modulus of 1.9 GPa) having a thickness of 100 μm was used, and no substrate 38 was formed was also examined. In this case, the distance y from the neutral axis to the surface of the inorganic insulating film 34 was 48 μm, and a crack occurred in the inorganic insulating film 34.

The upper limit value for the distance y from the neutral axis to the surface of the inorganic insulating film 34 to prevent crack occurrence varies depending upon the constituting materials for the device and the radius of curvature, and thus cannot be defined exactly, but from the results of the above-mentioned examination, it can be found that, when a silicon nitride film having a thickness of 150 nm is used as the inorganic insulating film 34, the materials and the film thicknesses of the substrates 22 and 38 must be selected such that the distance y from the neutral axis to the face of the inorganic insulating film 34 is less than 47 μm, and preferably is 21 μm or less.

Thus, according to the present embodiment, a substrate is formed on the inorganic insulating film for sealing the organic EL device to bring the neutral axis when a bending stress is applied, close to the inorganic insulating film, and thus occurrence of cracks in the inorganic insulating film is prevented, which allows the organic EL device to be effectively protected against moisture and oxygen. As a result, the reliability of the display apparatus can be improved.

In addition, on the top surface side of the organic EL device, an inorganic insulating film for sealing the organic EL device is formed with no organic insulating film being provided therebetween, thus degradation of the organic EL device due to moisture and oxygen during the manufacturing process and after the manufacture thereof can be suppressed.

In addition, the series of film formation processes from the formation of the organic EL layer to the formation of the inorganic insulating film is carried out consecutively in a vacuum environment, and thus, the organic EL layer can be sealed by the inorganic insulating film without being exposed to moisture and oxygen in the atmosphere during manufacturing, which allows degradation of the characteristics of the organic EL device to be further suppressed.

Second Embodiment

Figure 6:
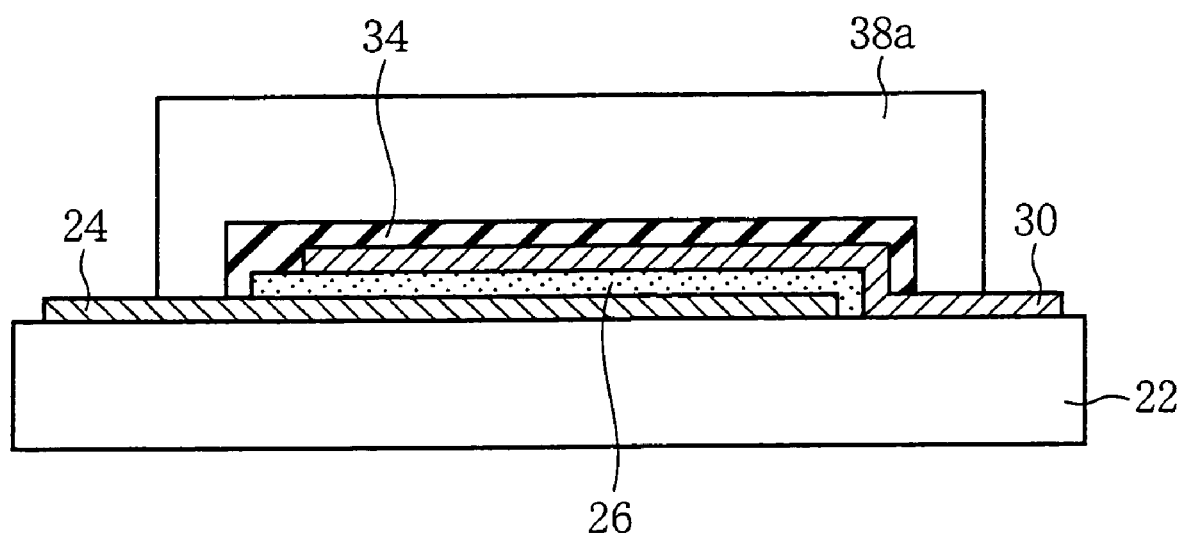
FIG. 6 is a schematic sectional view illustrating the structure of the display apparatus according to a second embodiment of the present invention.

A display apparatus and a manufacturing method therefor according to a second embodiment of the present invention will be described with reference to FIGS. 6 and 7. FIG. 6 is a schematic sectional view illustrating the structure of the display apparatus according to the present embodiment, and FIG. 7 are process sectional views illustrating the manufacturing method for a display apparatus according to the present embodiment. The same components as those of the display apparatus according to the first embodiment and the manufacturing method therefor as shown in FIGS. 3 to 5 will be provided with the same signs, and the explanation thereof will be omitted or simplified.

First, the structure of the display apparatus according to the present embodiment will be described with reference to FIG. 6.

On a substrate 22 made up of polycarbonate, an electrode 24 of the anode side made up of ITO is formed. On the electrode 24, an organic EL layer 26 including a hole transport layer made up of α-NPD and a luminescent layer made up of $Alq_3$ is formed. On the organic EL layer 26, an electrode 30 of the cathode side made up of Al—Li is formed. Thereby, an organic EL device including the electrode 24, the organic EL layer 26, and the electrode 30 is configured. On the substrate 22 on which the organic EL device is formed, an inorganic insulating film 34 made up of a silicon nitride-oxide film is formed such that it seals the organic EL layer 26. On the inorganic insulating film 34, a substrate 38a made up of polycarbonate is formed.

Thus, the display apparatus according to the present embodiment is the same as the display apparatus according to the first embodiment, except that the substrate 38a formed on the inorganic insulating film 34 is composed of polycarbonate, which is the same material as that of the substrate 22. By applying the materials which are the same in rigidity to the facing substrates 22, 38a, the neutral axis can be easily positioned in the region between the substrate 22 and the substrate 38a. Thereby, the neutral axis can be brought close to the inorganic insulating film 34, which can prevent a crack from occurring in the inorganic insulating film 34.

Here, the wording "the same in rigidity" refers to that, assuming that the Young's modulus of the substrate 22 is $E_1$, the thickness $t_1$, the Young's modulus of the substrate 38a $E_2$, and the thickness $t_2$, the relationship $$E_1 t_1^2 \approx E_3 t_3^2 \quad (9)$$

is met. Therefore, the substrate 22 and the substrate 38a not always need to be made of the same material and have the same thickness, and the material and thickness of the substrate 22, 38a may be appropriately selected so as to meet the relationship as given in equation (9).

Next, the manufacturing method for a display apparatus according to the present embodiment will be described with reference to FIG. 7.

First, by the method similar to the manufacturing method for a display apparatus according to the first embodiment as shown in FIG. 4A to FIG. 5A, the organic EL device and the inorganic insulating film 34 are formed on the substrate 22.

Then, by using the method as given below, for example, the substrate 38a made up of polycarbonate is formed on the inorganic insulating film 34.

First, onto the entire surface of the substrate 38a made up of polycarbonate having a film thickness of 100 mm, a UV curable type adhesive (for example, XNR5516 manufactured by Nagase ChemteX Corporation) is coated. Then, by the vacuum lamination method, the substrate 22 and the substrate 38a are affixed to each other such that the adhesive-coated surface is contacted with the inorganic insulating film 34 (FIG. 7A).

Figure 7A:
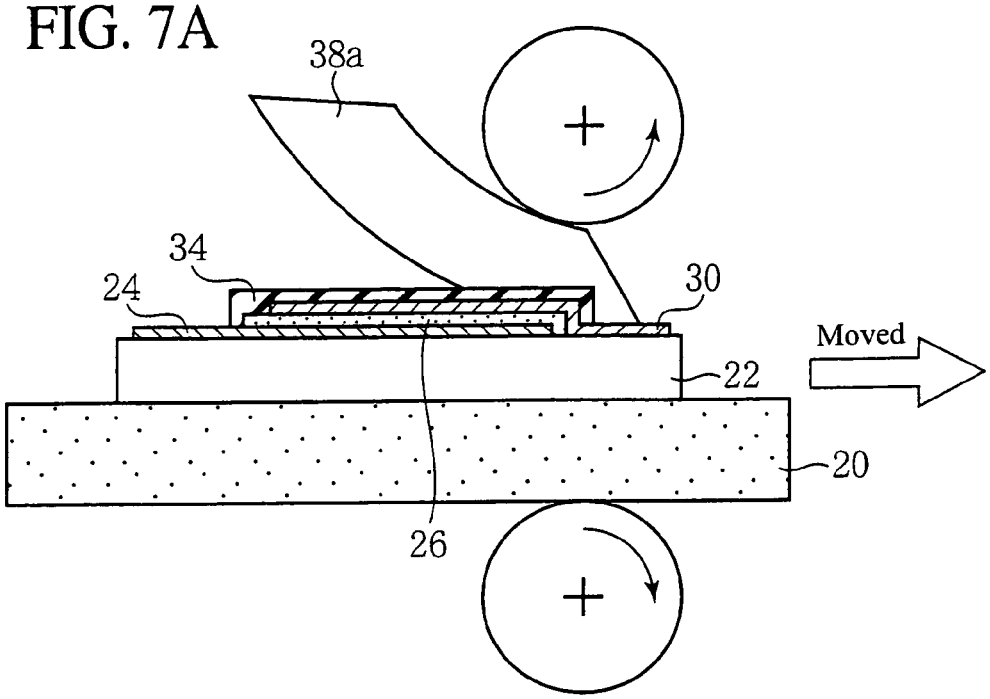
FIG. 7 are process sectional views illustrating the manufacturing method for a display apparatus according to the second embodiment of the present invention.

In affixing the substrate 38a to the substrate 22 side, the substrate 38a is gradually affixed onto the substrate 22 from one side of the substrate 38a, while being bent as shown in FIG. 7A. Thereby, the substrate 38a can be affixed to the substrate 22 with no air bubbles being trapped. By performing this operation in vacuum, i.e., by carrying out the vacuum lamination, the occurrence and inclusion of air bubbles can be suppressed.

If, in affixing the substrate 38a to the substrate 22, the substrate 22 side is bent, bending stresses are concentrated on the inorganic insulating film 34 which is formed on the front face side of the substrate 22, which may result in a crack occurring therein. Therefore, it is desirable that, in affixing the substrate 38a, the substrate 38a be affixed while being bent.

Figure 7B:
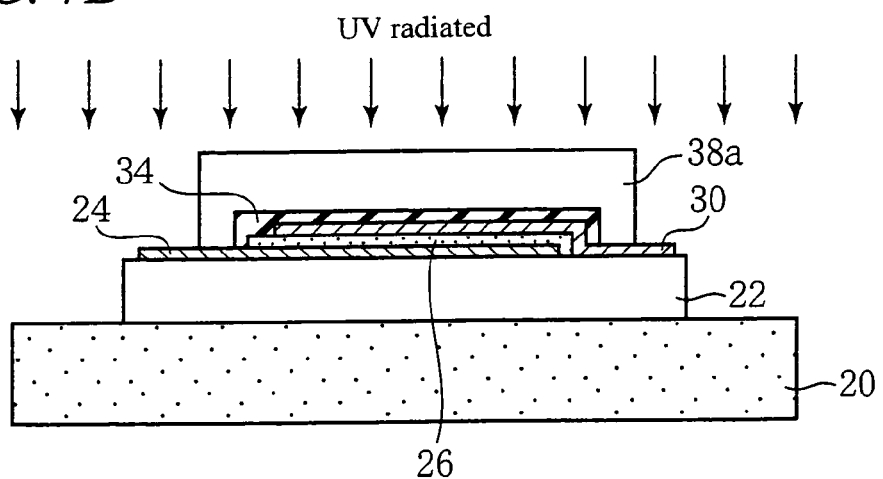
Figure 7C:
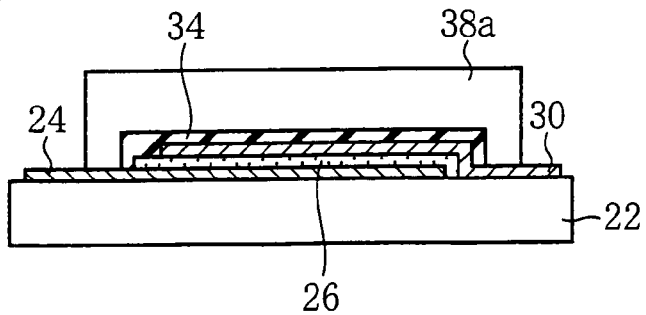

Thereafter, ultraviolet light having a wavelength of 365 nm, for example, is radiated at 18 J/cm2, for example, from the substrate 38a side to cause the adhesive to be cured FIG. 7B).

It is desirable that the above-mentioned process of affixing the substrate 38a be carried out in the vacuum system which is consecutive from the series of film formation processes from the formation of the organic EL layer 26 to the formation of the inorganic insulating film 34. Thereby, the two substrates can be finished into an integral rigid body without the organic EL layer being exposed to moisture and oxygen in the atmosphere, and with no air bubbles being sandwiched between the substrate 22 and the substrate 38a.

Then, by removing the glass substrate 20 after affixing the substrate 38a, the display apparatus as shown in FIG. 6 can be manufactured.

The display apparatus manufactured by the above-mentioned manufacturing method was subjected to bending with a radius of curvature of 5 mm to examine whether a crack occurs in the inorganic insulating film 34.

With the above-mentioned structure for which, as the substrate 22, a polycarbonate film (with a Young's modulus of 1.9 GPa) having a thickness of 100 μm was used, and as the substrate 38a, a polycarbonate film (with a Young's modulus of 1.9 GPa) having a thickness of 100 μm was used, the distance y from the neutral axis to the interface between the inorganic insulating film 34 and the substrate 38a was 0.1 μm, and no crack occurred in the inorganic insulating film 34.

Thus, according to the present embodiment, the organic EL device is sandwiched between the two substrates which have the same rigidity, thus the neutral axis when a bending stress is applied can be brought close to the inorganic insulating film. Thereby, occurrence of cracks in the inorganic insulating film is prevented, which allows the organic EL device to be effectively protected against moisture and oxygen. As a result, the reliability of the display apparatus can be improved.

In addition, on the top surface of the organic EL device, an inorganic insulating film for sealing the organic EL layer is formed with no organic insulating film being provided therebetween, thus degradation of the organic EL device due to moisture and oxygen during the manufacturing process and after the manufacture thereof can be suppressed.

In addition, the series of film formation processes from the formation of the organic EL layer to the formation of the inorganic insulating film is carried out consecutively in a vacuum environment, and thus, the organic EL layer can be sealed by the inorganic insulating film without being exposed to moisture and oxygen in the atmosphere during manufacturing, which allows degradation of the characteristics of the organic EL device to be further suppressed.

Third Embodiment

Figure 8:
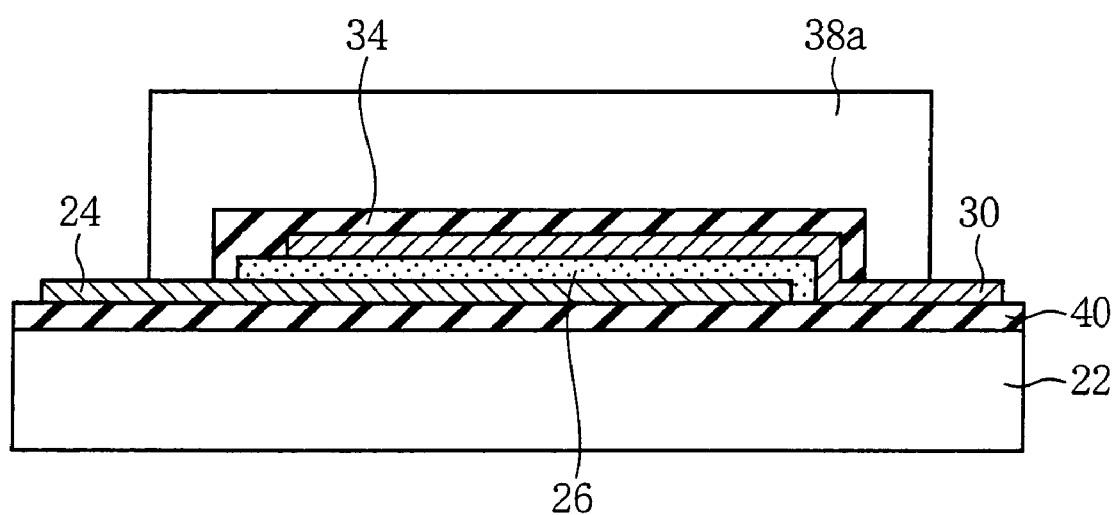
FIG. 8 is a schematic sectional view illustrating the structure of the display apparatus according to a third embodiment of the present invention.

A display apparatus and a manufacturing method therefor according to a third embodiment of the present invention will be described with reference to FIGS. 8 and 9. FIG. 8 is a schematic sectional view illustrating the structure of the display apparatus according to the present embodiment, and FIG. 9 are process sectional views illustrating the manufacturing method for a display apparatus according to the present embodiment. The same components as those of the display apparatus according to the first and second embodiments and the manufacturing methods therefor as shown in FIGS. 3 to 7 will be provided with the same signs, and the explanation thereof will be omitted or simplified.

First, the structure of the display apparatus according to the present embodiment will be described with reference to FIG. 8.

On a substrate 22 made up of polycarbonate, an inorganic insulating film 40 made up of a silicon nitride-oxide film is formed. On the inorganic insulating film 40, an electrode 24 of the anode side made up of ITO is formed. On the electrode 24, an organic EL layer 26 including a hole transport layer made up of α-NPD and a luminescent layer made up of Alq$_3$ is formed. On the organic EL layer 26, an electrode 30 of the cathode side made up of Al—Li is formed. Thereby, an organic EL device including the electrode 24, the organic EL layer 26, and the electrode 30 is configured. On the substrate 22 on which an organic EL device is formed, an inorganic insulating film 34 made up of a silicon nitride-oxide film is formed such that it seals the organic EL layer 26. On the inorganic insulating film 34, a substrate 38a made up of polycarbonate is formed.

Thus, the display apparatus according to the present embodiment is the same as the display apparatus according to the second embodiment, except that an inorganic insulating film 40 is formed between the substrate 22 and the electrode 24. By forming the inorganic insulating film 40 between the substrate 22 and the electrode, the protection against the surrounding air from the substrate 22 side is enhanced, and degradation of the organic EL device due to moisture, oxygen, and the like can be suppressed.

Also when the inorganic insulating film 40 is provided between the substrate 22 and the electrode 24, crack occurrence in the inorganic insulating films 34 and 40 can be prevented by providing the substrate 38a on the inorganic insulating film 34, which allows a highly flexible structure to be realized, while the function as a surrounding air barrier film for the organic EL device is being maintained.

The structure of the display apparatus according to the present embodiment is especially effective when the substrate 22 is made up of an organic material such as a resin film.

Next, the manufacturing method for a display apparatus according to the present embodiment will be described with reference to FIG. 9.

First, on a glass substrate 20 with a thickness of 1 mm, the substrate 22 made up of polycarbonate having a film thickness of 100 μm is set provisionally.

Then, by the plasma coating method, the inorganic insulating film 40 made up of a silicon nitride-oxide film having a film thickness of 150 nm, for example, is formed on the substrate 22.

In formation of a silicon nitride-oxide film, in order to suppress the film stress relaxation and the substrate temperature, it is desirable to scan five times, depositing a film 30 nm thick per scan, and cool the substrate at the time of waiting for film formation (during an interval between scans). Thereby, the substrate temperature can be held to below 75 deg C. and a uniform inorganic insulating film 40 which is free from defects, such as pin holes, and the like, can be formed, with no cracks being initiated in the inorganic insulating film 38.

Figure 9A:
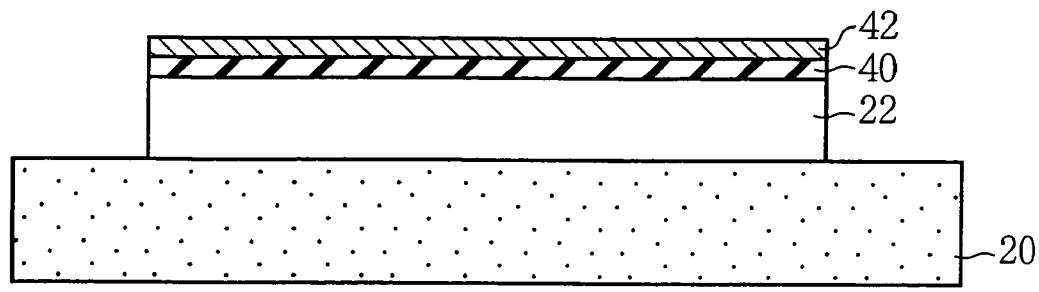
FIG. 9 are process sectional views illustrating the manufacturing method for a display apparatus according to the third embodiment of the present invention.

Then, by the sputtering method, for example, an ITO film 42 is formed on the inorganic insulating film 40 (FIG. 9A).

Figure 9B:
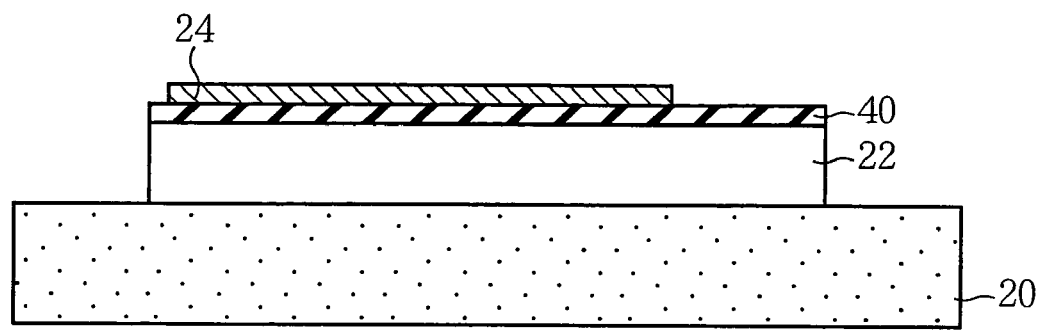

Then, by the photolithography and etching, the ITO film 42 is patterned to form the electrode 24 made up of the ITO film 42 on the inorganic insulating film 40 (FIG. 9B).

Figure 9C:
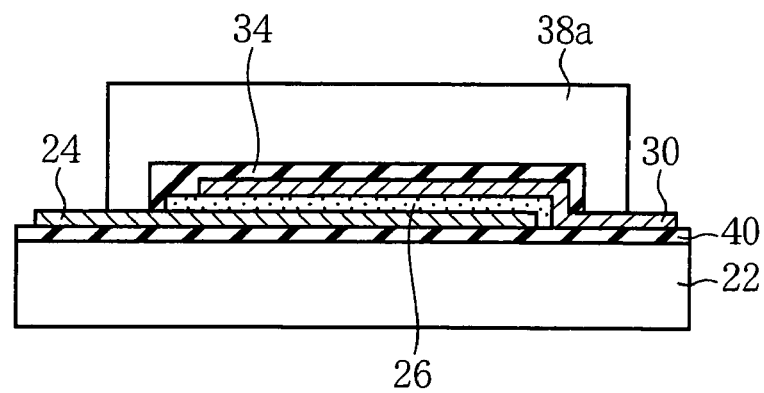

Then, by the method similar to the manufacturing methods for the display apparatuses according to the first and second embodiments as shown in FIG. 4B to FIG. 5A and FIG. 7A to FIG. 7C, for example, the display apparatus is completed (FIG. 9C).

In the series of film formation processes from the formation of the organic EL layer 26 to the formation of the inorganic insulating film 34, it is desirable that the film formation be performed consecutively in a vacuum environment without the substrate being opened to the atmosphere. Thereby, the organic EL layer 26 can be sealed by the inorganic insulating films 34 and 40 without being exposed to moisture and oxygen in the atmosphere during manufacturing, which allows degradation of the characteristics of the organic EL device to be suppressed.

Thus, according to the present embodiment, the organic EL device is sandwiched between the two substrates which have the same rigidity, thus the neutral axis when a bending stress is applied can be brought close to the inorganic insulating film. Thereby, occurrence of cracks in the inorganic insulating film is prevented, which allows the organic EL device to be effectively protected against moisture and oxygen. As a result, the reliability of the display apparatus can be improved.

In addition, on the top surface side and the bottom surface side of the organic EL device, an inorganic insulating film for sealing the organic EL device is formed, respectively, thus degradation of the organic EL device due to moisture and oxygen during the manufacturing process and after the manufacture thereof can be suppressed.

Particularly, by the inorganic insulating film on the bottom surface side, the protection against the surrounding air from the substrate 22 side can be enhanced, which allows degradation of the characteristics of the organic EL device to be further suppressed.

Fourth Embodiment

Figure 10:
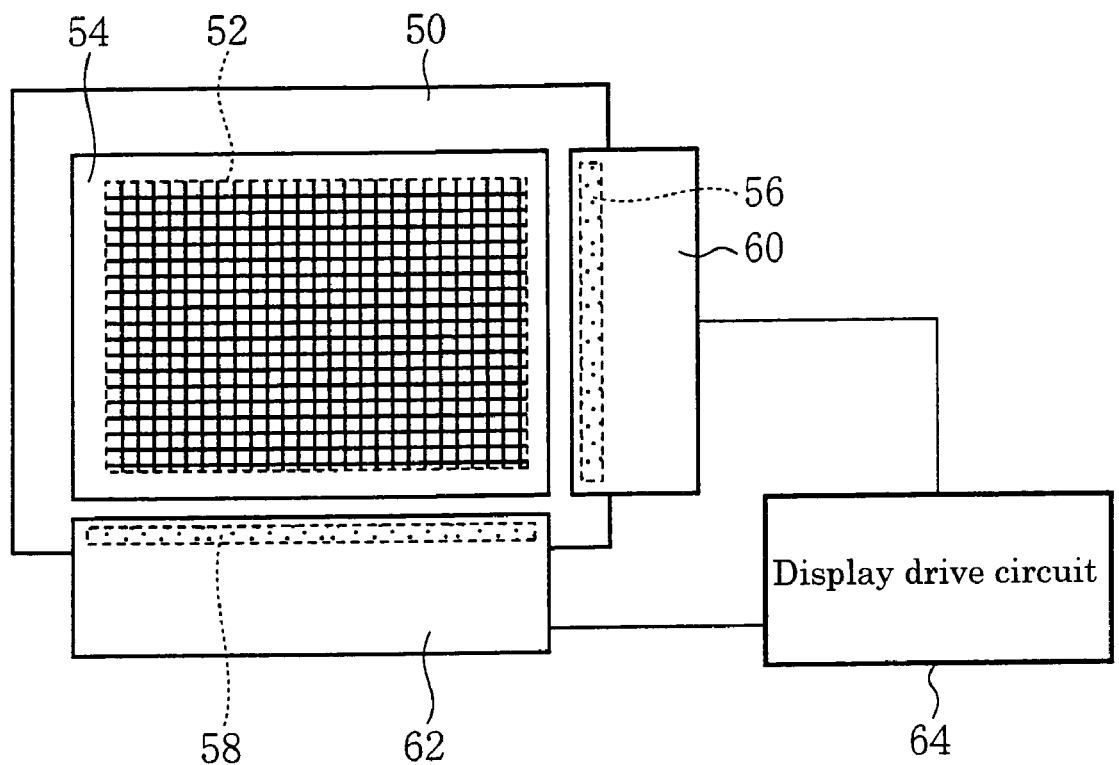
FIG. 10 is a plan view illustrating the structure of the display apparatus according to a fourth embodiment of the present invention.

A display apparatus and a manufacturing method therefor according to a fourth embodiment of the present invention will be described with reference to FIG. 10. FIG. 10 is a plan view illustrating the structure of the display apparatus according to the present embodiment.

The display apparatus according to the present embodiment is a display apparatus of simple matrix type to which the structure of the display apparatus according to the second embodiment is applied.

For example, in a substrate 50 made up of polycarbonate having a film thickness of 100 μm, an organic EL device formation region 52 is provided. In the organic EL device formation region 52, a plurality of organic EL devices are arranged in the shape of a matrix. Each organic EL device is, for example, the organic EL device in the display apparatus according to the second embodiment as shown in FIG. 6, including an electrode 24 as the anode that is formed on the substrate 50; an organic EL layer 26 which is formed on the electrode 24; an electrode 30 as the cathode that is formed on the organic EL layer 26; and an inorganic insulating film 34 which is formed so as to cover the organic EL layer 26. The electrodes 24 and the electrodes 30 have a stripe shape, extending in the directions which are orthogonal to each other, and in each part where the electrode 24 intersects with the electrode 30, the organic EL device constituting a pixel is formed, respectively. On the substrate 50 in which a plurality of organic EL devices are formed, a substrate 54 made up of polycarbonate having a film thickness of 100 μm, for example, is formed.

In the substrate 50, a terminal connection region 56 which is electrically connected to the electrodes (for example, the electrodes 24) extending in the row direction, and to which a wiring for applying a prescribed driving voltage is connected is provided. In addition, in the substrate 50, a terminal connection region 58 which is electrically connected to the electrodes (for example, the electrodes 30) extending in the column direction, and to which a wiring for applying a prescribed driving voltage is connected is provided. To the terminal connection regions 56 and 58, a display driving circuit 64 is connected through a terminal connection wiring boards 60 and 62, such as a flexible printed board, or the like.

From the viewpoint of disposition of the terminal connection regions 56 and 58 in the peripheral portion of the organic EL device formation region, it is desirable that the area of the substrate 54 be smaller than that of the substrate 50.

By applying a prescribed driving voltage across a given electrode 24 extending in the row direction, and a given electrode 30 extending in the column direction, the organic EL layer 26 located in the part where the electrode 24 intersects with the electrode 30 emits light. By using the display driving circuit 64 to appropriately select electrodes 24 extending in the row direction and electrodes 30 extending in the column direction, and applying the driving voltage across the electrodes 24 and 30, a desired image can be displayed in the organic EL device formation region.

In the display apparatus according to the present embodiment, a polycarbonate film is used as the substrates 50 and 54. Therefore, a display apparatus having flexibility can be configured. In addition, the structure of the display apparatus according to the second embodiment is applied, and the material and film thickness of the substrates 50 and 54 are appropriately selected such that the neutral axis when a bending stress is applied is brought close to the inorganic insulating layer 34, thus crack occurrence in the inorganic insulating layer 34 can be effectively prevented. Thereby, the organic EL layer 26 is thoroughly sealed, and degradation of the characteristics of the organic EL device can be suppressed.

Modification Embodiment

The present invention is not limited to the above-mentioned embodiments, but can provide various modifications.

For example, in the above-mentioned embodiments, polycarbonate or cellophane is used as the substrate, and a silicon nitride-oxide film is used as the inorganic insulating film, however, the materials of the substrate and inorganic insulating film that are applicable to the display apparatus of the present invention are not limited to these. The material and film thickness of the substrate and the material and film thickness of the inorganic insulating film may be appropriately selected according to the value of the radius of curvature which is required at maximum for the display apparatus, and the like.

In addition, in the above-mentioned fourth embodiment, the display apparatus of a simple matrix type has been described, however, a display apparatus of active matrix type in which a switching device of a thin film transistor (TFT), or the like, is provided in each pixel part, and with this switching device, the driving voltage to be applied to the organic EL device is controlled may be configured.

In addition, in the above-mentioned fourth embodiment, the structure of the organic EL device in the display apparatus according to the second embodiment is applied, however, the structure of the organic EL device in the display apparatus according to the first embodiment or the third embodiment may be applied.

INDUSTRIAL APPLICABILITY

The display apparatus and the manufacturing method therefor according to the present invention realize, in a display apparatus using an organic EL device and a manufacturing method therefor, a structure of a display apparatus that provides the organic EL device with high protection against the surrounding air and high flexibility, and a manufacturing method for a display apparatus that can realize such a structure by a simple process at low cost. Therefore, the present invention is extremely useful in application to a display apparatus which is high in flexibility, thin and lightweight. Besides this, it is also extremely useful in application to a display apparatus which can be folded or wound up for storage.

The invention claimed is:

1. A display apparatus comprising:
a first substrate;
an organic EL device comprising a first electrode which is formed on said first substrate, an organic EL layer which is formed on said first electrode, and a second electrode which is formed on said organic EL layer;
a first inorganic insulating film which is formed on said organic EL device, sealing said organic EL layer; and
a second substrate which is formed on said first inorganic insulating film,
wherein the material and the thickness of said first substrate and said second substrate are set such that the neutral axis when a bending stress is applied is located in the vicinity of the interface between said first inorganic insulating film and said second substrate, and
wherein the rigidity of said first substrate and the rigidity of said second substrate are identical to each other.

2. A display apparatus comprising:
a first substrate;
an organic EL device comprising a first electrode which is formed on said first substrate, an organic EL layer which is formed on said first electrode, and a second electrode which is formed on said organic EL layer;
a first inorganic insulating film which is directly formed on said organic EL device, sealing said organic EL layer; and a second substrate which is formed on said first inorganic insulating film, wherein the rigidity of said first substrate and the rigidity of said second substrate are identical to each other.

3. The display apparatus of claim 1, further comprising a second inorganic insulating film which is formed between said first substrate and said organic EL device so as to cover the bottom surface side of said organic EL layer.

4. The display apparatus of claim 1, wherein said first substrate and/or said second substrate are/is a resin film.

5. The display apparatus of claim 1, wherein said first substrate is larger than said second substrate.

6. The display apparatus of claim 5, wherein, on said first substrate outside the region in which said second substrate is formed, a terminal region in which said first electrode and said second electrode are connected to an external circuit is provided.

7. A display apparatus comprising:

a first substrate;

an organic EL device comprising a first electrode which is formed on said first substrate, an organic EL layer which is formed on said first electrode, and a second electrode which is formed on said organic EL layer;

a first inorganic insulating film which is formed on said organic EL device, sealing said organic EL layer; and a second substrate which is formed on said first inorganic insulating film, wherein the material and the thickness of said first substrate and said second substrate are set such that the neutral axis when a bending stress is applied is located in the vicinity of the interface between said first inorganic insulating film and said second substrate, and wherein said neutral axis is located between the location on said fast substrate side corresponding to 40% of the thickness of said first substrate from the interface of said inorganic insulating film on said first substrate side, and the location on said second substrate side corresponding to 40% of the thickness of said second substrate from the interface of said inorganic insulating film on said second substrate side.

8. A manufacturing method for a display device, comprising:

forming a first electrode on a first substrate;

forming an organic EL layer on said first electrode;

forming a second electrode on said organic EL layer;

forming a first inorganic insulating film so as to seal said organic EL layer; and forming, on said first inorganic insulating film, a second substrate in which the material and the thickness are set such that the neutral axis when a bending stress is applied is located in the vicinity of the interface with said first inorganic insulating film, wherein in said forming of the second substrate, said second substrate is formed so as to have the same rigidity as that of said first substrate.

9. The manufacturing method for a display apparatus of claim 8, further comprising forming a second inorganic insulating film for covering the bottom surface side of said organic EL layer before said forming of the first electrode.

10. The manufacturing method for a display apparatus of claim 8, wherein said forming of the organic EL layer to said forming of the first inorganic insulating film are consecutively carried out in a vacuum environment.

11. The manufacturing method for a display apparatus of claim 8, wherein in said forming of the second substrate, said second substrate which is coated with an adhesive is gradually affixed onto said first substrate from one side of said second substrate, while being bent.

12. The manufacturing method for a display apparatus of claim 11, wherein said forming of the second substrate is carried out in a vacuum environment.

13. The manufacturing method for a display apparatus of claim 8, wherein said second substrate is directly formed on said first inorganic insulating film.

14. The display apparatus of claim 2, further comprising a second inorganic insulating film which is formed between said first substrate and said organic EL device so as to cover the bottom surface side of said organic EL layer.

15. The display apparatus of claim 2, wherein said first substrate and/or said second substrate are/is a resin film.

16. The display apparatus of claim 2, wherein said first substrate is larger than said second substrate.

17. The display apparatus of claim 16, wherein, on said first substrate outside the region in which said second substrate is formed, a terminal region in which said first electrode and said second electrode are connected to an external circuit is provided.

18. The display apparatus of claim 7, further comprising a second inorganic insulating film which is formed between said first substrate and said organic EL device so as to cover the bottom surface side of said organic EL layer.

19. The display apparatus of claim 7, wherein said first substrate and/or said second substrate are/is a resin film.

20. The display apparatus of claim 7, wherein said first substrate is larger than said second substrate.

21. The display apparatus of claim 20, wherein, on said first substrate outside the region in which said second substrate is formed, a terminal region in which said first electrode and said second electrode are connected to an external circuit is provided.

* * * * *